US006583703B2

(12) United States Patent
Li

(10) Patent No.: US 6,583,703 B2
(45) Date of Patent: Jun. 24, 2003

(54) ELECTRICAL APPARATUS HAVING AN ELECTROMAGNETIC DEVICE OPERABLE AT MULTIPLE INDUCTANCE VALUES

(75) Inventor: Yushan Li, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/885,760

(22) Filed: Jun. 20, 2001

(65) Prior Publication Data

US 2002/0196118 A1 Dec. 26, 2002

(51) Int. Cl.[7] .................................................. H01F 27/29
(52) U.S. Cl. .......................... 336/192; 336/150; 336/170
(58) Field of Search .............................. 336/150, 192, 336/170, 180–184, 188, 189

(56) References Cited

U.S. PATENT DOCUMENTS 3,590,329 A * 6/1971 Krepps ........................ 336/183

6,211,767 B1 * 4/2001 Jitaru ......................... 336/200

OTHER PUBLICATIONS

Patent Abstracts of Japan, "No–Voltage Tap Switching Panel", Publication No. 07245219, Publication Date Sep. 19, 1995, by Tashiro Nobou.

* cited by examiner

Primary Examiner—Tuyen T. Nguyen

(57) ABSTRACT

An electrical apparatus and method for matching the input power source and output impedance of the electrical apparatus utilizes electromagnetic devices having two or more inductive windings, which may be connected in various series and/or parallel circuit configurations, by inserting them into a circuit board specially configured to accept my improved electromagnetic devices, and attaching jumpers to the circuit board for selecting the particular inductive windings to be incorporated into the electrical apparatus. The windings not selected for a given electromagnetic apparatus remain unconnected within the electromagnetic device.

16 Claims, 3 Drawing Sheets

US 6,583,703 B2

ELECTRICAL APPARATUS HAVING AN ELECTROMAGNETIC DEVICE OPERABLE AT MULTIPLE INDUCTANCE VALUES

TECHNICAL FIELD OF THE INVENTION

This invention relates to electrical circuits and apparatus having inductors or transformers.

BACKGROUND OF THE INVENTION

In an electrical apparatus, such as an inverter adapted for driving fluorescent lights, one or more input and/or output electromagnetic devices are typically required for matching the electrical apparatus to the input power source, and to the electrical load connected to the output of the apparatus. Such electromagnetic devices are commonly known as inductors, and transformers.

In simple terms, an inductor has a single inductive winding, and is used to compensate for variations in electrical current flow, whereas a transformer has two separate inductive windings located in close proximity to one another and utilizing electromagnetic coupling to provide circuit isolation or changes in voltage.

Typically, a different set of transformers and inductors is needed for each input/output voltage and/or current, or frequency, at which the apparatus will operate. This necessitates carrying an inventory of electromagnetic components of various values to cover the possible combinations of input and output conditions that a given electrical apparatus may encounter in operation, even if the basic electrical apparatus itself, aside from the input/output electromagnetic devices, can be used in a number of different applications. The need to carry this inventory increases the cost of producing and maintaining the electrical apparatus.

What is needed, therefore, is an improved electrical apparatus, having electromagnetic devices which are operable at multiple inductance values.

SUMMARY OF THE INVENTION

My invention provides such an improved electrical apparatus through utilization of electromagnetic devices having two or more inductive windings, which may be connected in various series and/or parallel circuit configurations, by inserting them into a circuit board specially configured to accept my improved electromagnetic devices, and attaching jumpers to the circuit board for selecting the particular inductive windings to be incorporated into the electrical apparatus. The windings not selected for a given electromagnetic apparatus remain unconnected within the electrical device.

In one form of my invention, an electrical apparatus comprises an electromagnetic device, a circuit board having an electrical circuit, and one or more jumpers for connecting the electromagnetic device to the electrical circuit. The electromagnetic device has a first and a second winding of common polarity. The electromagnetic device further includes pins electrically connected to the windings and adapted for attachment to a circuit board. The electrical circuit of the circuit board is adapted to receive the pins of the electromagnetic device, and the jumpers are adapted for attachment to the circuit board in a manner connecting the pins of the electromagnetic device to the electrical circuit to alternatively form an electrical connection between the first or second windings and the electrical circuit. The first and second windings of the electromagnetic device are formed from a number of turns of an electrical conductor, and in some forms of my invention the second winding has a different number of turns than the first winding.

In another form of my invention, the electrical apparatus also includes a third winding of common polarity with the first and second windings. The third winding is electrically connected to the pins of the electromagnetic device, and the jumpers are adapted for attachment to the circuit board in a manner connecting the pins of the electromagnetic device to the electrical circuit to alternatively form a series or a parallel electrical connection between the electrical circuit and two or more of the first, second, and third windings. The first, second, and third windings each include a number of turns, and at least one of the first, second, and third windings may have a different number of turns from the others of the first, second, and third windings.

The electromagnetic device may be a transformer with a primary and a secondary winding, with the first, second, and third windings forming a primary winding of the transformer. The first, second, and third windings may each have a different number of turns. The first, second, and third windings may also form the secondary winding of the transformer.

The electromagnetic device may also have more than three windings when constructed as either an inductor or a transformer.

My invention also includes a method for constructing the electrical apparatus in any of the forms described above, and in other forms within the scope of the appended claims.

The foregoing and other features and advantages of my invention will become further apparent from the following detailed description of exemplary embodiments, read in conjunction with the accompanying drawings. The detailed description and drawings are merely illustrative of my invention rather than limiting, the scope of the invention being defined by the appended claims and equivalents thereof.

BRIEF DESCRIPTION OF THE PRESENTLY PREFERRED EMBODIMENTS

Figure 1:
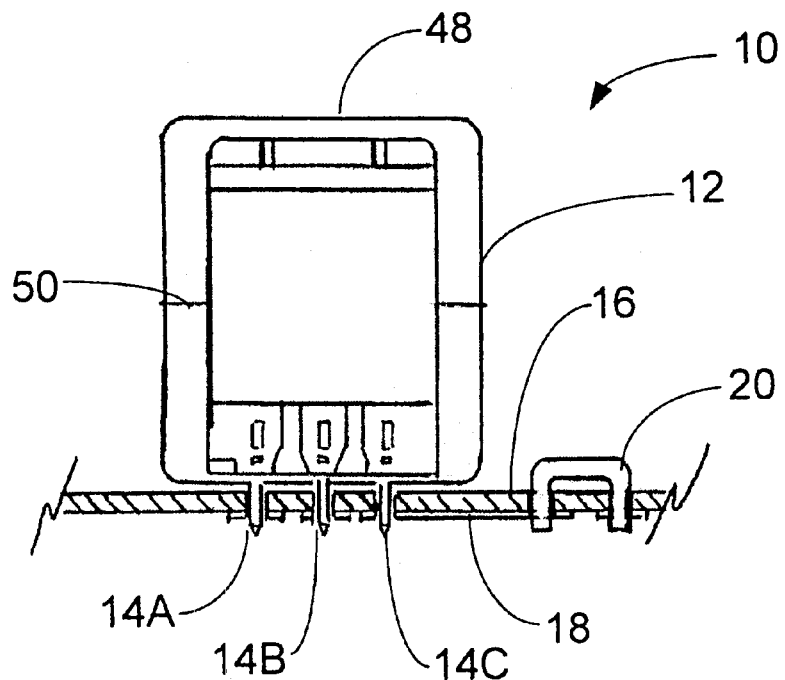
FIG. 1 is a partial sectional view of a first exemplary electrical apparatus, in accordance with my invention.

FIG. 1 shows a first exemplary electrical apparatus 10, according to my invention. The electrical apparatus 10 includes an electromagnetic device 12 having pins 14A, 14B, 14C for attaching the electromagnetic device 12 to a circuit board 16. The circuit board 16 includes electrically conductive traces forming an electrical circuit 18. One or more jumpers 20 connect the electromagnetic device 12 to the electrical circuit 18, in a manner to be described in greater detail below. The traces and jumpers 20 can be alternatively attached on either side of the circuit board 16, as required for convenience in constructing the electrical apparatus 10.

Figure 4:
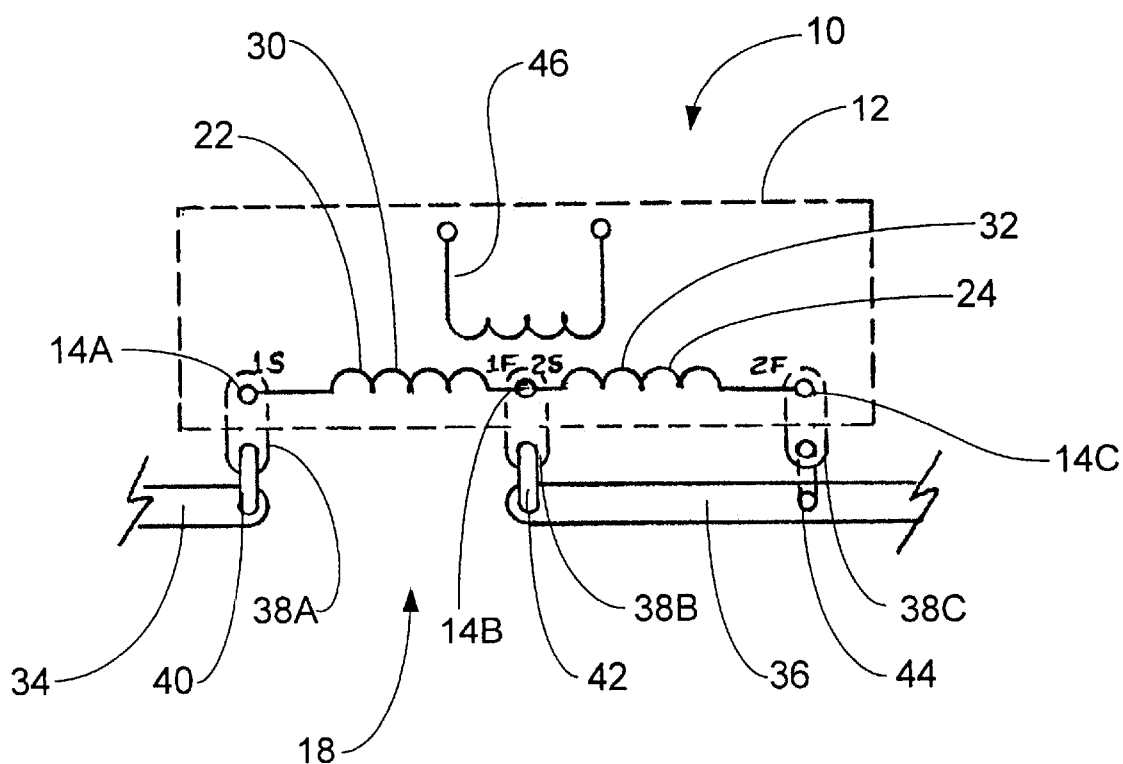
FIG. 4 is schematic representation of the exemplary electromagnetic device of FIG. 1, connected by jumpers to an electrical circuit of an electrical assembly, in accordance with my invention.

As shown in FIG. 4, the electromagnetic device 10 includes a first and a second winding 22, 24 having a common polarity, or said another way, having the windings 22, 24 wound in the same direction with respect to one another as they are mounted within the electromagnetic device 12. The first winding 22 begins at a starting end, designated as 1S, and terminates in a finishing end of the first winding, designated 1F. In similar fashion, the second winding 24 begins at a starting end 2S and is terminated at a finishing end 2F of the second winding 24.

As shown in FIGS. 1–4, the electromagnetic device 10 of the first exemplary embodiment includes a bobbin 26, having a central section about which the windings 22, 24 are formed by winding an electrical conductor 28 around the bobbin 26 to form a number of turns 30, 32 of the first and second windings 22, 24 respectively. In some forms of my invention it may be desirable to have the number of turns 30 of the first winding 22 equal the number of turns 32 of the second winding 24, and in other forms of my invention to utilize different numbers of turns 30, 32 in the first and second windings 22, 24.

As shown in FIG. 4, the first and second windings 22, 24 are connected to pins 14A, 14B, 14C extending from the bobbin 26 and adapted for attachment to the circuit board 16. Specifically, the first end 1S of the first winding is connected to a first pin 14A, and the second end 1F of the first winding 22 is connected to a second pin 14B of the electromagnetic device 12. The first end 2S of the second winding 24 is connected to the second pin 14B, and the second end 2F of the second winding 24 is connected to a third pin 14C of the electromagnetic device 12.

FIG. 4 also illustrates a series of electrical traces of the electrical circuit 18 including an input bus 34, and an output bus 36, and several connecting traces 38A, 38B, 38C adapted to receive the first, second, and third pins 14A, 14B, 14C, and a first and second jumper 40, 42. With the first jumper 40 attached between the input bus 34 and the first connecting trace 38A, and the second jumper 42 attached in a first position between the output bus 36 and the second connecting trace 38B, only the first winding 22 is connected to the electrical circuit 18 in a manner that allows current flow through the first winding 22 to develop an inductance in the first winding 22. If the second jumper 42 is alternatively connected in a second position, as indicated by dashed lines at 44 in FIG. 4, between the output bus 36 and the third connecting trace 38C, the first and second windings 22, 24 are commonly connected to the electrical circuit 18 in a series circuit configuration, to provide increased inductance in the electrical circuit 18.

As described to this point, the embodiment depicted in FIGS. 1–4 has been restricted to an electromagnetic device 12 in the form of an inductor. As shown in FIG. 4, however, the electromagnetic device 12 may also be a transformer, having a secondary winding 46, with the first and second windings 22, 24 described above comprising a primary winding of the transformer. Alternatively, the first and second windings 22, 24 may either or both form the secondary winding of the transformer, and the winding 46 may constitute the primary winding of the transformer. I also contemplate that the electromagnetic device 12 may be a transformer having both a primary and a secondary winding formed by a first and second winding, as described above. In any of these arrangements, my invention allows the inductive values of the windings to be selectively modified by moving the location of the jumpers 40, 42, to provide two or more inductive values from the same electromagnetic device 12.

Figure 2:
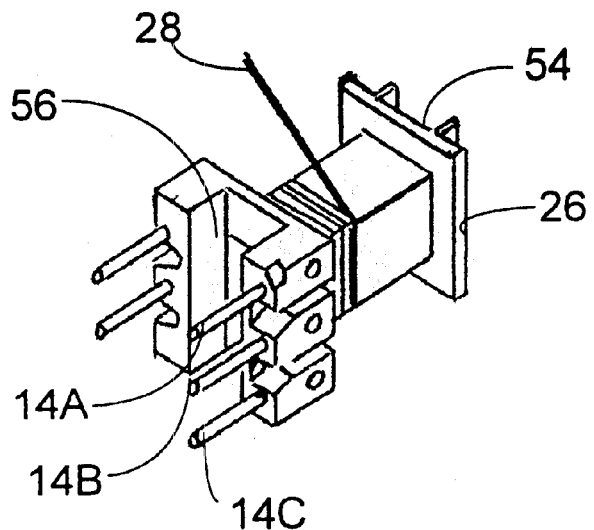
FIG. 2 is an isometric view of a bobbin of an electromagnetic device from the electrical apparatus depicted in FIG. 1.
Figure 3:
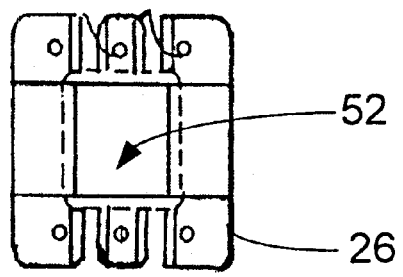
FIG. 3 is a bottom view of an electromagnetic device depicted in FIG. 1.

As shown in FIGS. 1–3, the electromagnetic device 12 of the first exemplary embodiment also includes a core 48 of electromagnetic material for improving the performance of the electromagnetic device 12. The core 48 is split along a horizontal line 50, as shown in FIG. 1, into two identical upper and a lower E-shaped sections, having a right, left and central leg joined by a horizontal upper or lower leg. The bobbin 26 includes a central opening 52 for passage of the central leg of the core 48, and a pair of corresponding channels 54, 56 at the top and bottom of the bobbin 26 for receipt of the horizontal upper and lower legs of the core 48. The upper and lower halves of the core 48 are inserted in the bobbin 26 after forming the first and second windings 22, 24, and secured by tape, banding, or potting materials (not shown). Those having skill in the art will readily recognize, however, that my invention is not limited to the particular construction shown in FIGS. 1–4 and described thus far. I contemplate that my invention may be practiced with a virtually unlimited variety of types of electromagnetic devices and constructions of such devices.

Figure 5:
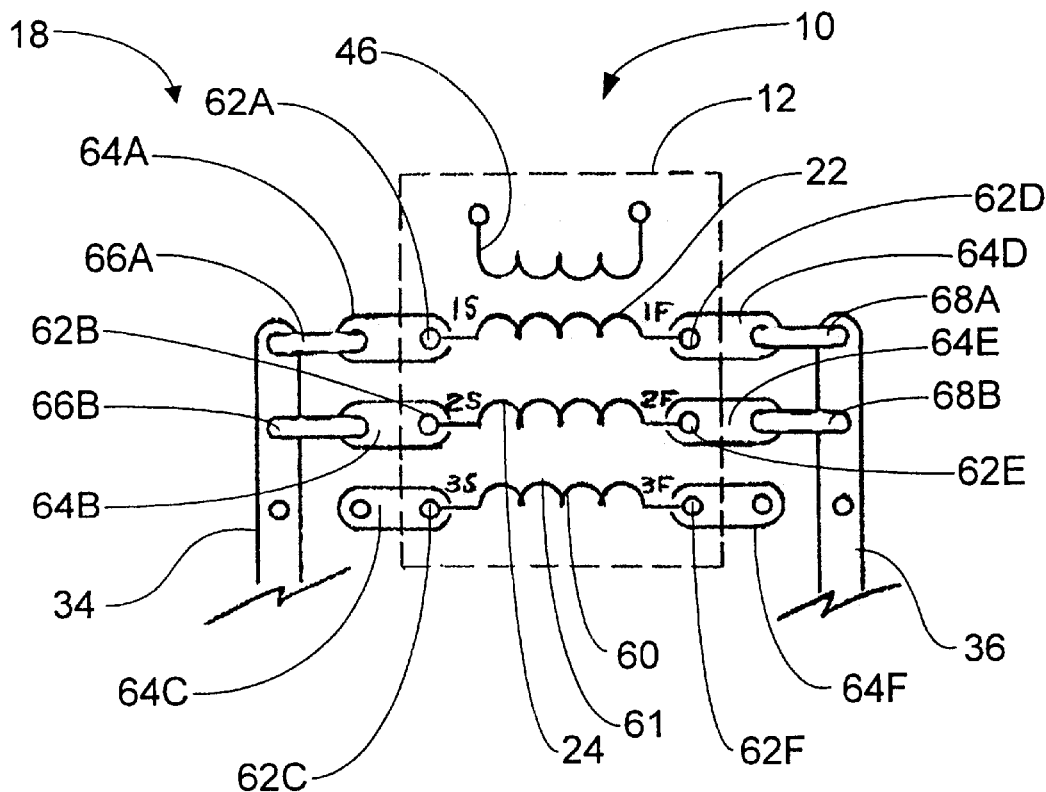
FIGS. 5 and 6 are schematic representations of a second exemplary embodiment of an electromagnetic device and circuit according to my invention, and illustrate the manner in which jumpers are utilized to connect the electromagnetic device to the circuit in a manner providing multiple inductive values from windings within the electromagnetic devices.
Figure 6:
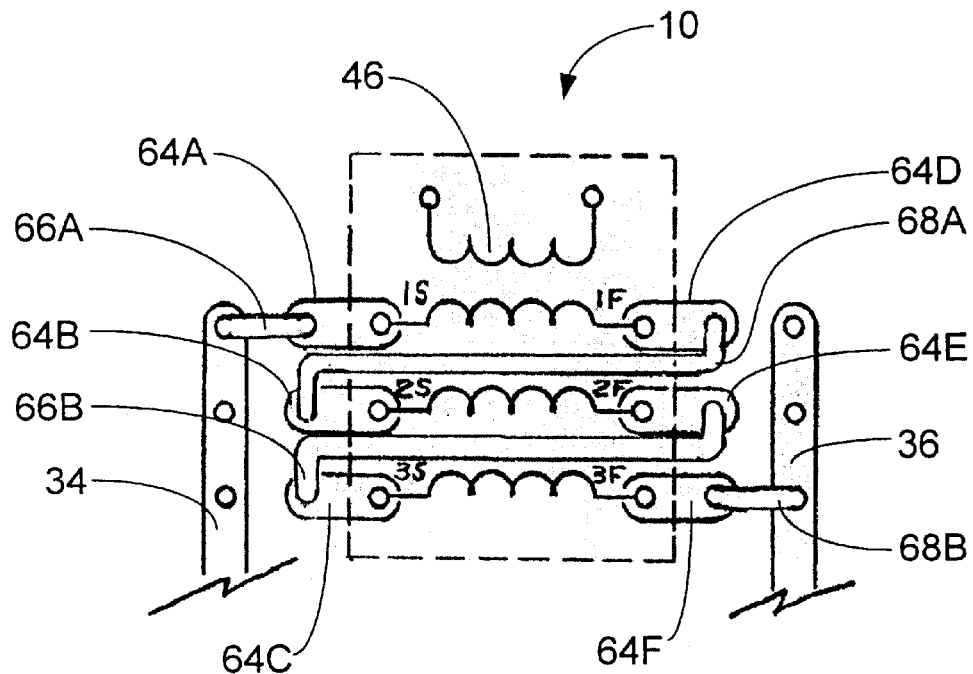

FIGS. 5 and 6 depict a second embodiment of an electrical apparatus 10, according to my invention, in which the electromagnetic device 12 includes a third winding 60 having a common polarity with the first and second windings 22, 24, and a number of turns 61. In keeping with the numbering scheme established above, the third winding begins at a starting end 3S and terminates at a finishing end 3F of the third winding 60. The first ends 1S, 2S, 3S of the first second and third windings 22, 24, 60 are respectively connected to a first, a second, and a third pin 62A, 62B, 62C of the electromagnetic device 12. The second ends 1F, 2F, 3F of the first second and third windings 22, 24, 60 are respectively connected to a fourth, a fifth, and a sixth pin 62D, 62E, 62F of the electromagnetic device 12.

The electrical circuit 18 of the embodiment shown in FIGS. 5 and 6 includes conductive traces defining the input and output buses 34, 36, and six connecting pads 64A–F adapted for receipt respectively of the pins 62A–F of the electromagnetic device 12.

When a first set of jumpers 66A, 66B are connected in a first position, as shown in FIG. 5, between the input bus 34 and the connecting pads 64A, 64B attached to the starting ends 1S, 2S of the first and second windings 22, 24 respectively, and a second set of jumpers 68A, 68B are connected in a first position between the output bus 36 and the connecting pads 64D, 64F attached to the finishing ends 1F, 2F of the first and second windings 22, 24 respectively, the first and second windings 22, 24 are connected in a parallel circuit relationship with respect to each other in the electrical circuit 18, and the third winding 60 is left totally unconnected.

Alternatively, as shown in FIG. 6, when the first and second sets of jumpers 66A, 66B, 68A, 68B are connected in a second position between the input and output buses 34, 35, the first, second, and third windings 22, 24, 60 are connected in a series circuit relationship with respect to each other in the electrical circuit 18. Specifically, with reference to the embodiment of FIG. 6, in the second position, one jumper 66A of the first set of the jumpers is connected between the input bus 34 and the connecting pad 64A attached to the starting end 1S of the first winding 22. The second jumper 66B of the first set of jumpers is connected between the connecting pad 64E attached to the finishing end 2F of the second winding 24, and the connecting pad 64C attached to the starting end 3S of the third winding 24. One jumper 68A of the second set of jumpers is connected between the connecting pad 64D attached to the finishing end 1F of the first winding 22, and the connecting pad 64B attached to the starting end 2S of the second winding 24. The second jumper 68B of the of the second set of jumpers is connected between the connecting pad 64F attached to the finishing end 3F of the third winding 60 and the output bus 36.

With the jumpers 66A, 66B and 68A, 68B in the first position, as shown in FIG. 5, the first and second windings 22, 24 work in parallel to reduce the electric resistance effectively in the first and second windings 22, 24. With the jumpers 66A, 66B and 68A, 68B in the second position, as shown in FIG. 6, the first, second, and third windings 22, 24, 60 working in series provide increased inductance in comparison to having the jumpers 66A, 66B, 68A, 68B attached in the first position. Other connection combinations are also possible with the embodiment depicted in FIGS. 5 and 6, by attaching the jumpers in yet other positions, and by adding or subtracting jumpers.

I also contemplate embodiments of my invention having more than three windings that may be connected in various combinations to provide an electromagnetic device 12 having even more options for adjusting the inductance of the electromagnetic device 12 as required for use a variety of electrical apparatus embodiments.

As shown in the embodiment depicted in FIGS. 5 and 6, the electromagnetic device 12 may also be a transformer having a secondary winding 46, with the connected ones of the first, second, and third windings 22, 24, 60 forming the primary winding of the transformer. As described above with respect to the earlier described embodiments, the role of the primary and secondary windings may be reversed in the embodiment depicted in FIGS. 5 and 6.

Although the forgoing description has utilized certain exemplary embodiments of my invention, many other changes and modifications can be made without departing from the spirit and scope of my invention. For example, although the embodiments in FIGS. 4–6 depict an electromagnetic device 12 having two or three windings 22, 24, 60, my invention may be practiced with electromagnetic devices having more than three windings. It is also expressly noted that the number of turns 30, 32, 61 depicted in the accompanying drawings are strictly schematic in nature, and are not intended to represent a particular number of turns. My invention may be practiced with multiple windings having an equal, or unequal number of turns, and with windings having more or less turns than are shown in the accompanying drawings.

From the foregoing description, it has been shown that my invention provides the needed capability to match input/output power requirements in an electrical apparatus, without having to replace electromagnetic components of the electrical apparatus, by having electromagnetic devices that are operable at multiple inductance values.

The scope of my invention is limited only by the appended claims, and all changes that come within the meaning and range of equivalents are intended to be embraced therein.

I claim:
1. An electrical apparatus comprising:
   an electromagnetic device having at least a first and a second winding of common polarity, the electromagnetic device further including pins electrically connected to the windings and adapted for attachment to a circuit board;
   a circuit board having an electrical circuit, and adapted to receive the pins of the electromagnetic device; and
   one or more jumpers adapted for attachment to the circuit board in a manner connecting the pins of the electromagnetic device to the electrical circuit to alternatively form a series or parallel electrical connection between at least one of the first or second windings and the electrical circuit.
2. The apparatus of claim 1 wherein the first and second windings include turns, and the second winding has a different number of turns than the first winding.
3. The apparatus of claim 1 wherein the electromagnetic device further comprises a third winding of common polarity with the first and second windings electrically connected to the pins of the electromagnetic device, and wherein the jumpers are adapted for attachment to the circuit board in a manner connecting the pins of the electromagnetic device to the electrical circuit to alternatively form a series or a parallel electrical connection between two or more of the first, second, and third windings and the electrical circuit.
4. The apparatus of claim 3 wherein the first, second, and third windings each include a number of turns, with at least one of the first, second, and third windings having a different number of turns from the others of the first, second, and third windings.
5. An electrical apparatus comprising:
   an electromagnetic device having a first and a second winding of common polarity, the electromagnetic device further including pins electrically connected to the windings and adapted for attachment to a circuit board;
   a circuit board having an electrical circuit, and adapted to receive the pins of the electromagnetic device;
   one or more jumpers adapted for attachment to the circuit board in a manner connecting the pins of the electromagnetic device to the electrical circuit to alternatively form an electrical connection between the first or second windings and the electrical circuit;
   wherein each of the first and second windings includes a starting end and a finishing end, with the starting end of the first winding being connected to a first pin, the finishing end of the first winding and the starting end of the second winding being connected to a second pin, and the finishing end of the second winding being attached to a third pin of the electromagnetic device; and
   wherein the electrical circuit is configured in such a manner that with a jumper attached in a first position between the electrical circuit and the second pin of the electromagnetic device, the first winding is connected to the electrical circuit and the second winding is not connected to the electrical circuit, and with the jumper alternatively connected in a second position between the electrical circuit and the third pin of the electromagnetic device that the first and second windings are commonly connected to the electrical circuit in a series circuit configuration, the electromagnetic device thereby providing increased inductance when attached to the electrical circuit with the jumper in the second position.

6. An electrical apparatus comprising:
an electromagnetic device having a first and a second winding of common polarity, the electromagnetic device further including pins electrically connected to the windings and adapted for attachment to a circuit board;
a circuit board having an electrical circuit, and adapted to receive the pins of the electromagnetic device;
a plurality of jumpers comprising a first set and a second set of the jumpers adapted for attachment to the circuit board in a manner connecting the pins of the electromagnetic device to the electrical circuit to alternatively form an electrical connection between the first or second windings and the electrical circuit;
   wherein each of the first and second windings of the electromagnetic device includes a starting end and a finishing end, with the starting end of the first winding being connected to a first pin, the finishing end of the first winding connected to a second pin, the first end of the second winding being connected to a third pin and the finishing end of the second winding being attached to a fourth pin of the electromagnetic device; and
   wherein the electrical circuit is configured in such a manner that with the first set of the jumpers attached in a first position between the electrical circuit and the first and second pins of the electromagnetic device, and the second set jumpers attached between the electrical circuit and the third and fourth pins of the electromagnetic device, the first and second windings are connected in a parallel circuit arrangement to the electrical circuit.

7. The apparatus of claim 6 wherein the electrical circuit further configured in such a manner that with the first set of jumpers connected in a second position between the electrical circuit and the first and second pins of the electromagnetic device, and the second set jumpers attached in a second position between the electrical circuit and the third and fourth pins of the electromagnetic device, the first and second windings are connected in a series circuit arrangement to the electrical circuit.

8. The apparatus of claim 1 wherein the electrical device is a transformer and further comprises a secondary winding, the first and second windings forming a primary winding of the transformer.

9. The apparatus of claim 8 wherein the first and second windings include turns, and the second winding has a different number of turns than the first winding.

10. The apparatus of claim 8 wherein the electromagnetic device further comprises a third winding of common polarity with the first and second windings electrically connected to the pins of the electromagnetic device, and wherein the jumpers are adapted for attachment to the circuit board in a manner connecting the pins of the electromagnetic device to the electrical circuit to alternatively form a series or a parallel electrical connection between two or more of the first, second, and third windings and the electrical circuit.

11. The apparatus of claim 1 wherein the electrical device is a transformer and further comprises a secondary winding, the first and second windings forming the secondary winding of the transformer.

12. The apparatus of claim 11 wherein the first and second windings include turns, and the second winding has a different number of turns than the first winding.

13. The apparatus of claim 11 wherein the electromagnetic device further comprises a third winding of common polarity with the first and second windings electrically connected to the pins of the electromagnetic device, and wherein the jumpers are adapted for attachment to the circuit board in a manner connecting the pins of the electromagnetic device to the electrical circuit to alternatively form a secondary winding having a series or a parallel electrical connection between two or more of the first, second, and third windings and the electrical circuit.

14. The apparatus of claim 1 wherein each of the first and second windings includes a starting end and a finishing end, with the starting end of the first winding being connected to a first pin, the finishing end of the first winding and the starting end of the second winding being connected to a second pin, and the finishing end of the second winding being attached to a third pin of the electromagnetic device; and
   wherein the electrical circuit is configured in such a manner that with a jumper attached in a first position between the electrical circuit and the second pin of the electromagnetic device, the first winding is connected to the electrical circuit and the second winding is not connected to the electrical circuit, and with the jumper alternatively connected in a second position between the electrical circuit and the third pin of the electromagnetic device that the first and second windings are commonly connected to the electrical circuit in a series circuit configuration, the electromagnetic device thereby providing increased inductance when attached to the electrical circuit with the jumper in the second position.

15. The apparatus of claim 1 further including a plurality of jumpers comprising a first set and a second set of the jumpers, and wherein:
   each of the first and second windings of the electromagnetic device includes a starting end and a finishing end, with the starting end of the first winding being connected to a first pin, the finishing end of the first winding connected to a second pin, the first end of the second winding being connected to a third pin and the finishing end of the second winding being attached to a fourth pin of the electromagnetic device; and
   the electrical circuit is configured in such a manner that with the first set of the jumpers attached in a first position between the electrical circuit and the first and second pins of the electromagnetic device, and the second set jumpers attached between the electrical circuit and the third and fourth pins of the electromagnetic device, the first and second windings are connected in a parallel circuit arrangement to the electrical circuit.

16. The apparatus of claim 15 wherein the electrical circuit further configured in such a manner that with the first set of jumpers connected in a second position between the electrical circuit and the first and second pins of the electromagnetic device, and the second set jumpers attached in a second position between the electrical circuit and the third and fourth pins of the electromagnetic device, the first and second windings are connected in a series circuit arrangement to the electrical circuit.

* * * * *